United States Patent [19]

Harvey et al.

[11] Patent Number: 5,144,261
[45] Date of Patent: Sep. 1, 1992

[54] OPTICALLY INJECTION LOCKED RESONANT TUNNEL DIODE OSCILLATOR

[75] Inventors: James F. Harvey, Tinton Falls; Robert A. Lux, Toms River; Thomas P. Higgins, Tinton Falls; Arthur Paolella, Howell; Dana J. Sturzebecher, Tinton Falls, all of N.J.

[73] Assignee: The United States of America as represented by the Secretary of the Army, Washington, D.C.

[21] Appl. No.: 821,729

[22] Filed: Jan. 15, 1992

[51] Int. Cl.⁵ .............................................. H03L 7/00
[52] U.S. Cl. .................................. 331/66; 331/107 R; 331/107 T
[58] Field of Search .............. 331/66, 107 R, 107 DP, 331/107 SL, 107 T; 357/56

[56] References Cited
U.S. PATENT DOCUMENTS

| | | |
|---|---|---|
| 4,503,403 | 3/1985 | Taylor et al. .......................... 331/66 |
| 4,617,532 | 10/1986 | Chen et al. ............................ 331/66 |
| 4,849,716 | 7/1989 | Golio et al. ............................ 331/66 |
| 5,093,699 | 3/1992 | Wrichold et al. ...................... 357/56 |

Primary Examiner—Robert J. Pascal
Attorney, Agent, or Firm—Michael Zelenka; William H. Anderson

[57] ABSTRACT

An optically injection locked resonant tunnel diode oscillator assembly having a resonant tunnel diode (RTD) which, when voltage biased, oscillates at a free running frequency; an optical signal delivery system, such as a light intensity modulator connected to optical fibers; and other oscillator circuitry which one skilled in the art could readily adapt to the concepts of the present invention. In operation, the free running oscillation of the RTD can be locked to the phase and frequency of the intensity modulated optical signal delivered via the optical signal delivery system. This injection locking occurs as the modulation frequency approaches the free running oscillation frequency.

9 Claims, 3 Drawing Sheets

OPTICALLY INJECTION LOCKED RESONANT TUNNEL DIODE OSCILLATOR

GOVERNMENT INTEREST

The invention described herein may be manufactured, used and licensed by or for the Government of the United States for governmental purposes without the payment to us of any royalties thereon.

FIELD OF THE INVENTION

The invention described herein relates to injection locked oscillators, and more particularly to optically controlled injection locked oscillators which utilize resonant tunnel diodes.

BACKGROUND OF THE INVENTION

A growing interest has developed for the direct optical control of semiconductor devices due to the potential applications in phased array radar and communications. The following list of documents comprises a sample of articles which concern the design and optical control of such devices.

1. A. S. Daryoush, "Optical Synchronization of Millimeter-Wave Oscillators for Distributed Architectures," IEEE Trans. Microwave Theory Tech., Vol. 38, pp. 467–476, May 1990; and a related article by, K. Kurokawa, "Injection Locking of Microwave Solid-State Oscillators," Proc, IEEE 61, 1386 (1973).

2. A. J. Seeds and A. A. A. DeSalle, "Optical Control of Microwave Semiconductor Devices," IEEE Trans. Microwave Theory Tech., Vol. 38, pp. 577–584, May 1990.

3. T. C. L. G. Sollner, E. R. Brown and H. Q. Le, "Microwave and Millimeter-Wave Resonant-Tunneling Devices," Lincoln Lab. Jour., Vol. 1, pp. 89–105, 1988.

4. S. C. Kan, S. Sanders, G. Griffel, G. H. Lang, S. Wu, and A. Yariv, "Optical Switching of a New Middle Trace in an Optically Controlled Parallel Resonant Tunneling Device-Observation and Modeling," Appl. Phys. Lett., Vol. 58, pp. 1548–1550, 1991.

5. P. England, J. Yee, L. T. Florez, J. P. Harbison and J. E. Golub, "Optical Switching in Resonant Tunneling Structures," Conference on Quantum Electronics Laser Science, May 12–17, 1991, Baltimore, Md., 1991 Technical Digest Series, Vol 11, p. 34, 1991.

6. D. J. Struzbecher, J. F. Harvey, T. P. Higgins, A. C. Paolella, and R. A. Lux, "Direct Optical Frequency Modulation of a Resonant Tunnel Diode Oscillator," submitted to IEEE Electron Device Lett., Jul. 29, 1991.

7. L. L. Chang, L. Esaki and R. Tsu, "Resonant Tunneling in Semiconductor Double Barriers," Appl. Phys. Lett., Vol. 24, pp. 593–595, 1974.

8. I. Mehdi, R. K. Mains, and G. I. Haddad, "Effect of Spacer Layer Thickness on the Static Characteristics of Resonant Tunneling Diodes," Appl. Phys. Lett. 57, 899 (1990); and a related article by J. E. Oh, I. Mehdi, J. Pamulapati, P. K. Bhattacharya, and G. I. Haddad, "The Effect of Molecular Beam Epitaxial Growth Conditions on the Electrical Characteristics of $In_{0.52}Al_{0.48}As/In_{0.53}Ga_{0.47}As$ Resonant Tunneling Diodes," J. Appl. Phys. 65, 842 (1989); I. Mehdi, R. K. Mains, G. I. Haddad, and U. K. Reddy, "Properties and Device Applications of Deep Quantum Well Resonant Tunneling Structures," Surf. Sci. 228, 426 (1990); and also by the same authors, R. K. Mains, I. Mehdi, and G. I. Haddad, "Effect of Spatially Variable Effective Mass on Static and Dynamic Properties of Resonant Tunneling Devices," Appl. Phys. Lett. 55, 2631 (1989).

9. C. J. Arsenault and M. Meunier, "Proposed New Resonant Tunneling Structures with Impurity Planes of Deep Levels in Barriers," J. Appl. Phys. 66, 4305 (1989).

10. R. L. Wang, Y. K. Su, Y. H. Wang, and K. F. Yarn, "Negative Differential Resistance of a Delta-Doping-Induced Double Barrier Quantum-Well Diode at Room Temperature," IEEE Electron Dev. Lett. 11, 428 (1990).

11. V. K. Reddy, A. J. Tsao, S. Javalagi, G. K. Kumar, D. R. Miller, and D. P. Neikirk, "Quantum well injection transit time (QWITT) diode oscillators," in Conference Digest Fifteenth International Conference on Infrared and Millimeter Waves, 10–14 December 1990, Orlando, Fla., ed. R. J. Temkin, (SPIE vol. 1514), p. 88.

12. J. M. Gering, T. J. Rudnick, and P. D. Coleman, "Microwave Detection Using the Resonant Tunneling Diode," IEEE Trans. Microwave Thry. and Tech. 36, 1145 (1988).

13. T. C. L. G. Sollner, P. E. Tannenwald, D. D. Peck, and W. D. Goodhue, "Quantum Well Oscillators," Appl. Phys. Lett. 45, 1319 (1984); and a related article by, E. R. Brown, T. C. L. G. Sollner, W. D. Goodhue, and C. D. Parker, "Millimeter-Band Oscillations Based on Resonant Tunneling in a Double-Barrier Diode at Room Temperature," Appl. Phys. Lett. 50, 83 (1987).

14. G. Keiser, Optical Fiber Communications, (McGraw-Hill, N.Y., 1983) and see C. K. Kao, Optical Fiber Systems: Technology, Design, and Applications, (McGraw, 1982).

As is evident from the above cited references, the technology of building resonant tunnel diodes (RTDs) is well established. As well, the technology of microwave light generation and delivery using lasers, light emitting diodes, plasma tubes and the like in combination with intensity modulators and fiber optics is also well known. Therefore, as is suggested by the above identified references, one skilled in the art would readily be able to design any number of optical or integrated optic systems to deliver intensity modulated light in the microwave power range with photon energies above the bandgap of a semiconductive device material to the semiconductive device and incorporate such a semiconductive device in oscillator circuit applications.

An example of an important technical field where such semiconductor devices would be able to be directly incorporated is in phased array radar and communication systems. As suggested by reference 1, these semiconductor devices would synchronize active oscillator modules distributed over an antenna array. One means of achieving synchronization, as suggested by reference 1, is by injection locking oscillators with a direct optical signal delivered over optical fibers. In relation to reference 1, reference 2 describes the various means which are available to optically control semiconductor devices, including the direct optical injection locking of oscillators utilizing IMPATTS, FETs, and HEMTs. However, these semiconductor devices lack some of the enhanced performance characteristics of RTDs and, therefore, synchronization of oscillator modules would be further optimized by optically controlling RTDs incorporated in such oscillators.

The present invention addresses this present need for direct optical control of an RTD to injection lock an RTD oscillator.

SUMMARY OF THE INVENTION

One object of the invention is to control the frequency, phase and frequency spread of a multiple gigahertz semiconductor oscillator with minimum noise using an externally modulated optical signal.

Another object of the invention is to provide this control using an external signal which can be easily transmitted over a media which is not influenced by other electrical signals and which is light weight and inexpensive.

In accordance with these objectives, the present invention provides an oscillator based on a resonant tunneling structure which controls frequency, phase, and frequency spread by directly injection-locking the oscillator to the modulation frequency of an external intensity modulated optical signal.

In the most generic embodiment of the present invention, the optically controlled, injection locked oscillator comprises a resonant tunnel diode (RTD) which, when voltage biased, oscillates at a free running frequency; an optical signal delivery system, such as a light intensity modulator connected to optical fibers; and other oscillator circuitry which one skilled in the art could readily adapt to the concepts of the present invention. In operation, the free running oscillation of the RTD can be locked to the phase and frequency of the intensity modulated optical signal delivered via the optical signal delivery system. This injection locking occurs as the modulation frequency approaches the free running oscillation frequency. In experiments conducted by the inventors herein, injection locking of the oscillator occurred over a bandwidth of 150 Kilohertz with a noted reduction in FM noise.

BRIEF DESCRIPTION OF THE DRAWINGS

These and other objects, features and details of the present invention will become apparent in light of the ensuing detailed disclosure, and particularly in light of the drawings wherein.

DESCRIPTION OF THE PREFERRED EMBODIMENT

As shown in FIGS. 1, 2, 3 and 4, a circuit or assembly 10 is provided. Assembly 10 includes an input light emitter subassembly 11 and an oscillator subassembly 12. Assembly 10 may also have an optional add-on output power sensor or test subassembly (not shown) which would be part of the load impedance $Z_L$ 25.

Figure 1:
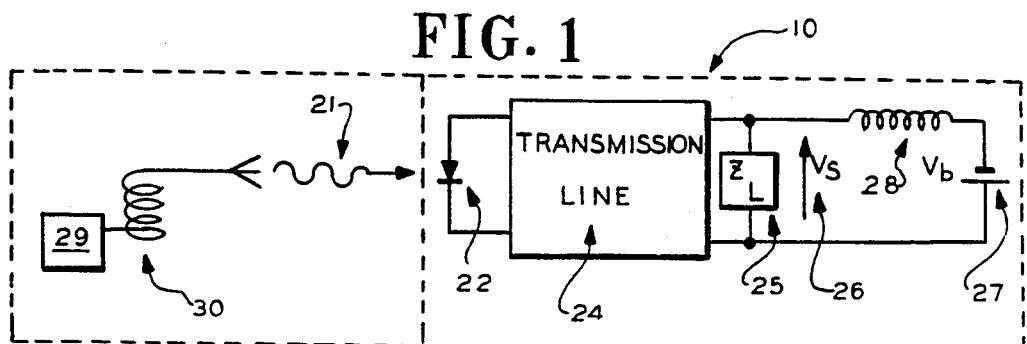
FIG. 1 is a schematic circuit diagram of an optically modulated resonant tunnel diode oscillator assembly according to the present invention.
Figure 2:
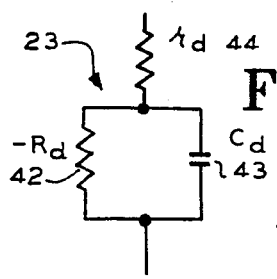
FIG. 2 is an equivalent circuit diagram of a portion of FIG. 1.

As shown in FIGS. 1 and 2, oscillator subassembly 12 receives modulated light from emitter subassembly 11. Incorporated in oscillator subassembly 12 is the resonant tunnel diode 22. FIG. 2 shows an approximate equivalent circuit of the RTD 22 with a shunt capacitance $C_d$ 43 caused by the charge separation in the RTD layers; a negative shunt resistance $-R_d$ 42 caused by the negative differential resistance portion of the RTD I-V characteristic; and a series resistance $r_d$ 44 caused by the resistance of the contacts, of the semiconductor layers on each side of the tunneling structure, and of the substrate. Oscillator subassembly 12 also has a transmission line propagation circuit 24, which terminates in a load impedance 25; a bias voltage 27; and an AC isolation circuit 28 for the DC bias voltage. In operation, the transmission line 24 matches the load impedance $Z_L$ 25 to the impedance of the RTD 22. The load impedance $Z_L$ 25 produces a Vs output 26 and a variable impedance to tune the oscillator and thus, load impedance $Z_L$ would obviously have to include any other necessary load circuits, such as subsequent amplifier stages or an antenna circuit.

Figure 3:
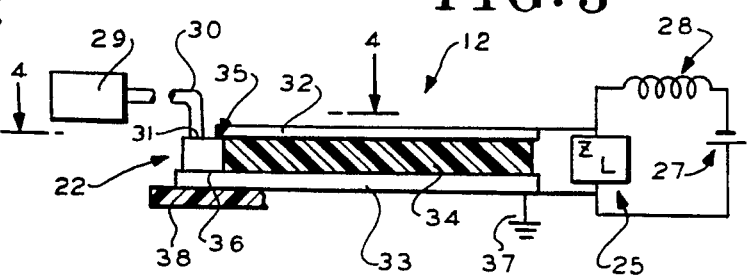
FIG. 3 is an edge elevation view of an embodiment corresponding to the circuit diagram of FIG. 1.
Figure 4:
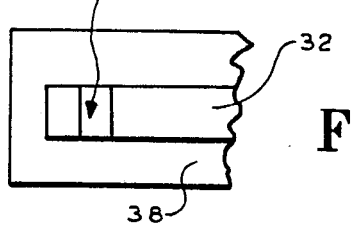
FIG. 4 is a partial planar view as taken along the line 4—4 of FIG. 3.

As shown in FIGS. 3 and 4, emitter subassembly 11 has a modulated laser 29 and an optical fiber 30 which projects light 21. RTD diode 22 has an interface 31 with an opening for an optical signal from the optical fiber 30. As shown in structural detail in FIG. 3, oscillator subassembly 12 may comprise an upper metal strip of transmission line 32, a metal ground strip or plane of transmission line 33, a transmission line dielectric or dielectric layer 34 sandwiched between metal strips 33 and 34 and a ground plane 38 attached to the bottom portion of metal ground strip 33. RTD diode 22 is connected to transmission line 32 and ground plane 33 via ohmic contacts 35 and 36. The circuit is completed by grounding ground plane 33 via transmission line ground connection 37.

In operation, RTD 22 is biased in the negative differential resistance (NDR) region. When so biased, the RTD oscillates at a free-running frequency which is determined by the internal and external capacitances and the external inductance of the device. The free-running oscillation of RTD 22 is then locked to the phase and frequency of the intensity modulated optic signal 21 which is delivered via subassembly 11. Due to the injection locking of the RTD, intensity modulation of the optical signal results in frequency modulation of the RTD oscillator.

When tested, it was found that, as the modulation frequency in the experiment approached the free running oscillator frequency, injection locking over a bandwidth of 150 kilohertz occurred with a marked reduction in FM noise.

Figure 6:
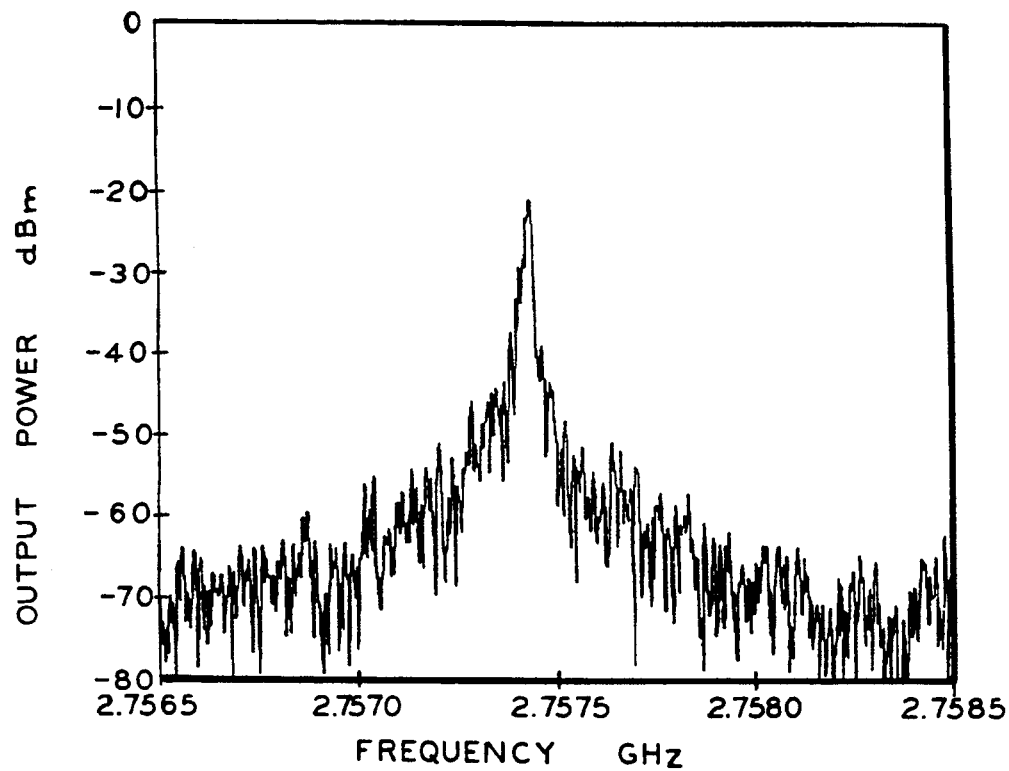
FIG. 6 is a curve of output power versus frequency showing the power spectrum of the unlocked oscillator subassembly portion of FIG. 5.
Figure 7:
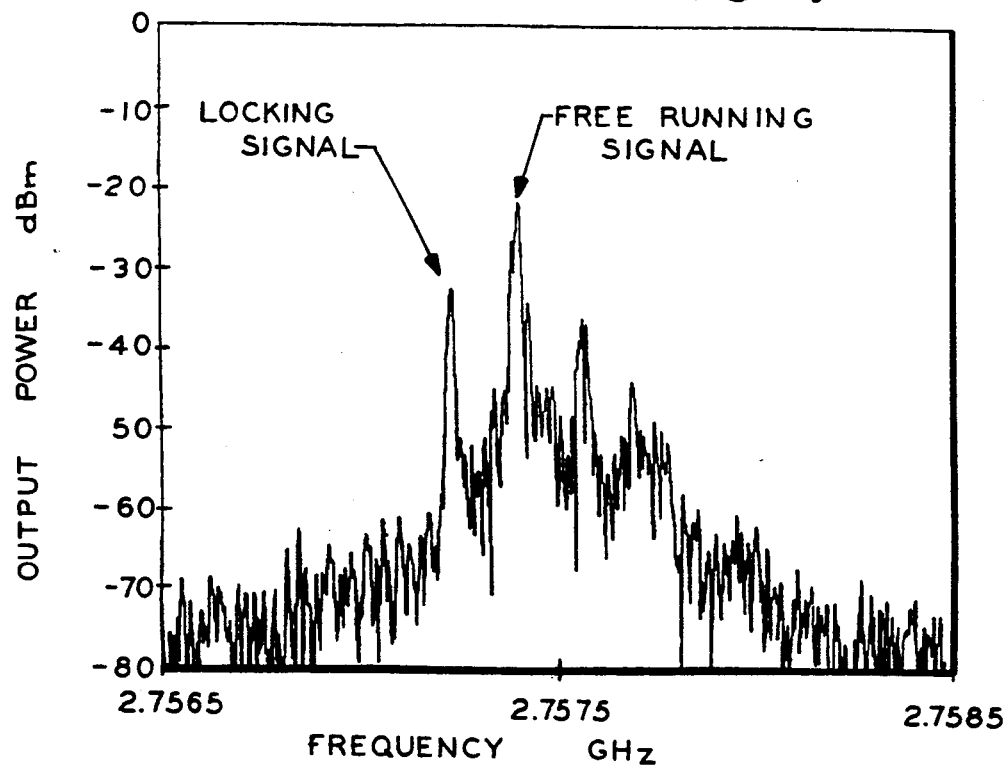
FIG. 7 is a curve of output power versus frequency of the oscillator subassembly portion of FIG. 5 showing the power spectrum of the unlocked oscillator together with the optically injected signal which is shown as the left most peak.
Figure 8:
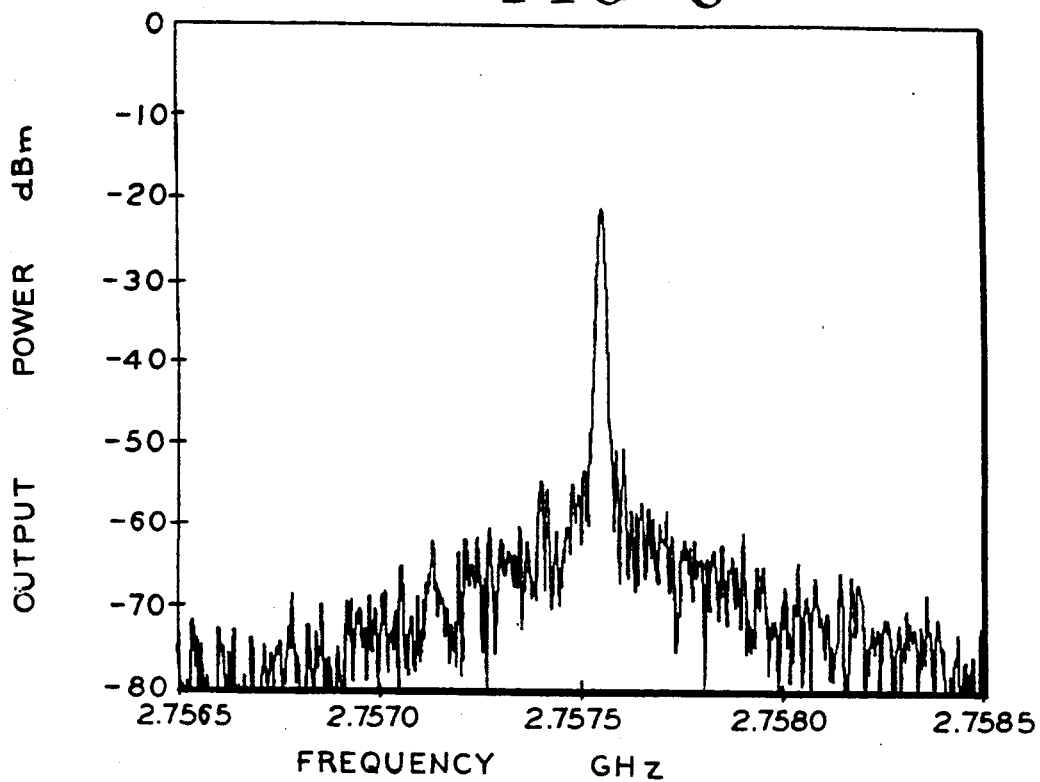
FIG. 8 is a curve of the output power versus frequency for the oscillator subassembly portion of FIG. 5 for showing the power spectrum of the injection locked oscillator.
Figure 9:
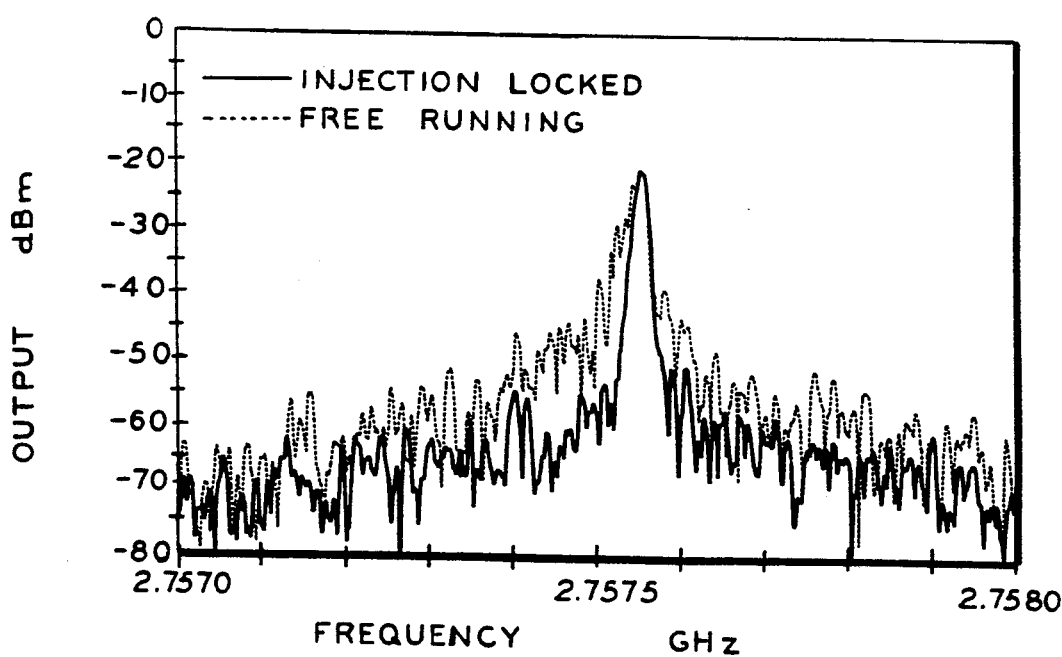
FIG. 9 is a superimposition of the curves from FIGS. 6 and 8.

FIG. 6 shows the free running signal of the RTD oscillator with no injected signal. FIG. 7 shows the RTD oscillator signal with an optically injected signal, as previously described. FIG. 8 shows the oscillator signal after it has locked to the injected signal and FIG. 9 shows a superimposition of the signals from FIG. 6 and FIG. 8 which compares the free running oscillator signal to the injection locked oscillator signal. As shown in FIG. 9, the injection locked signal has lower FM noise and a narrower frequency spread centered on the injected signal frequency. This behavior is typical of injection locked oscillators. This experiment was preliminary in nature to demonstrate the feasibility of the technique. The oscillator circuit, the RTD structure, and the optical coupling were all non-optimized. Therefore, the curves in FIGS. 6-9 demonstrate the physical effect and they do not depict the optimum conditions or limitations of this technique.

The physical mechanisms responsible for this behavior involve the generation by the absorbed light of electron-hole pairs. Light absorbed in the GaAs material (primarily in the substrate) creates electron-hole pairs, changing the carrier density, and hence the series resistance ($r_d$ in FIG. 2) of the RTD at the same frequency as the variations in the light intensity. The varying $r_d$ causes a varying current in the RTD, constituting an injected signal at the same frequency and phase as the modulated light signal. There will also be a contribution to the injected signal from holes generated by the absorbed light in the substrate, in the barriers, in the GaAs layers on each side of the barriers, and in the quantum well. These holes become trapped at the RTD interfaces, causing a change in the voltage drop across each layer of material in the RTD. The varying voltage drop causes a varying current in the RTD. The total overall injected signal causes locking of the RTD oscillator, as described in ref. 1.

Figure 5:
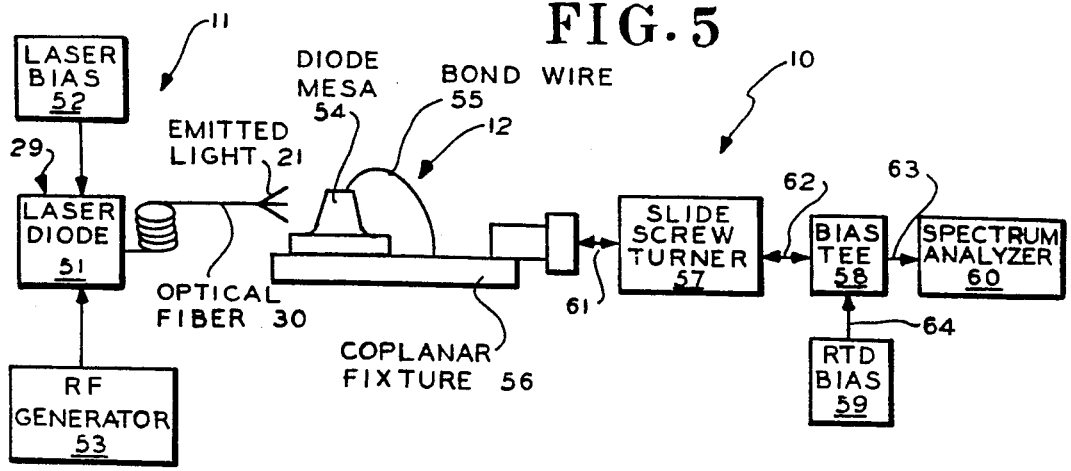
FIG. 5 is a schematic block diagram of a test circuit used as an initial demonstration of the direct optical injection locking of an RTD oscillator as embodied by the present invention.

As shown in FIG. 5, which is the schematic diagram of the initial test circuit, laser 29 has a laser diode 51, a laser bias unit 52, and an RF generator 53. Optical fiber 30 connects at a first end thereof to laser diode 51 and directs light beam 21 at the other end thereof onto RTD diode 22. RTD diode 22 has a top portion or diode mesa 54 which receives light 21, and has a bond wire 55 which connects to strip 32, and has a coplanar fixture 56. The test circuit also includes a slide screw tuner 57, a bias tee 58, an RTD bias unit 59, and a spectrum analyzer 60. Tuner 57 has an inboard coaxial line 61, which connects to RTD diode 22, and has an outboard coaxial line 62 which connects to bias tee 58. Analyzer 60 has an input conductor 63 which connects to bias tee 58. RTD bias 59 has an output conductor 64 which connects to bias tee 58.

The advantages of assembly 10 are indicated hereafter.

Assembly 10 has the potential for external optical control of the frequency, phase and frequency spread of a semiconductor oscillator 12 operating at higher frequency and with less noise than oscillators constructed from other semiconductor devices.

Since resonant tunnel diodes (RTDs) have demonstrated operation at frequencies as high as 700 Gigahertz with very low noise, it is expected that injection locked oscillators can be built which operate at higher frequencies and with lower noise than oscillators using other semiconductor devices.

Assembly 10 can be used in various applications, including phase array radar, phased array communication systems, remote control of microwave and millimeter wave antennas, EMI/EMP hardening by optical devices for low power signal processing, and optical isolation of microwave subsystems to reduce vulnerability to reflected microwave power and to permit separate shielding from EMI and EMP.

While the invention has been described in its preferred embodiment, it is to be understood that the words which have been used are words of description rather than words of limitation and that changes may be made within the purview of the appended claims without departing from the true scope and spirit of the invention in its broader aspects.

For example, other ways can be used to couple the light into the RTD 22. Other circuits can be used to propagate the output signal, such as transmission line, waveguide, or resonators of various geometries. Other ways can be used to connect the propagation circuit to the RTD 22. Other ways can be used to terminate the propagation circuit in a load. And other ways can be used to isolate the DC bias circuit from the AC circuit. As well, various materials can be used for substrate 38.

What is claimed is:

1. An injection locked oscillator comprising:
   an intensity modulated optical signal delivery system;
   oscillator circuitry; and
   a resonant tunnel diode incorporated in the oscillator circuitry, the resonant tunnel diode being exposed to an intensity modulated optical signal delivered by the optical signal delivery system;
   whereby the resonant tunnel diode is biased such that it oscillates at a free running frequency and the free running oscillation of the resonant tunnel diode is capable of being locked to the phase and frequency of the intensity modulated optical signal when the modulated optical signal approaches the free running oscillation frequency.

2. The injection locked oscillator of claim 1 wherein the intensity modulated signal has a photon energy level near or above the band gap energy level of the material comprising the resonant tunnel diode.

3. An injection locked oscillator comprising:
   a light source;
   a light intensity modulator optically connected to the light source;
   at least one optic fiber optically connected to the light intensity modulator;
   oscillator circuitry; and
   a resonant tunnel diode incorporated in the oscillator circuitry, the resonant tunnel diode being optically coupled to at least one optic fiber such that an intensity modulated light signal produced by the light source and modulated by the light intensity modulator may be absorbed by the resonant tunnel diode;
   whereby the resonant tunnel diode is biased such that it oscillates at a free running frequency and the free running oscillation of the resonant tunnel diode is capable of being locked to the phase and frequency of the intensity modulated optical signal when the modulated optical signal approaches the free running oscillation frequency.

4. The injection locked oscillator of claim 3, wherein the oscillator circuitry has first and second transmission lines which have respective first and second metal strip portions that are separated by a dielectric layer.

5. The injection locked oscillator of claim 3, wherein said light source is a laser diode.

6. The injection locked oscillator of claim 4, wherein an end portion of the first metal strip portion forms an ohmic contact with a top portion of the resonant tunnel diode, and wherein an end portion of the second metal strip portion forms an ohmic contact with a base portion of the resonant tunnel diode.

7. The injection locked oscillator of claim 3, wherein the oscillator circuitry includes a slide screw tuner for tuning the free running oscillation of the resonant tunnel diode; and includes a spectrum analyzer for display; and includes a bias tee coupled to a bias voltage unit for bias voltage to the resonant tunnel diode.

8. An optically injection-locked resonant tunnel diode oscillator assembly comprising:
   an intensity modulated light emitter having an optical fiber;
   oscillator circuitry having a resonant tunnel diode which has a mesa portion for receiving a light beam from the optical fiber and which has a base portion;
   said oscillator circuitry having a circuit portion connected between the mesa portion and the base portion for driving the resonant tunnel diode at a free running frequency; and
   means connected to the input light emitter for setting a selective value of modulation of an optical signal emitted from said input light emitter to said mesa portion resulting in a selective value of locked frequency in the resonant tunnel diode.

9. A method of locking a free running frequency of a resonant tunnel diode oscillator including the steps of:
   generating a light signal which is intensity modulated;
   passing the signal through an optical fiber and out from an end thereof;
   causing a free running frequency to pass from a first portion to a second portion of a resonant tunnel diode;
   directing the light signal from the optical fiber onto a surface portion of the resonant tunnel diode.

* * * * *